US009023217B2

(12) United States Patent
Winoto et al.

(10) Patent No.: US 9,023,217 B2
(45) Date of Patent: May 5, 2015

(54) ETCH PATTERNING OF NANOSTRUCTURE TRANSPARENT CONDUCTORS

(75) Inventors: Adrian Winoto, San Francisco, CA (US); Jeffrey Wolk, Half Moon Bay, CA (US)

(73) Assignee: Cambrios Technologies Corporation, Sunnyvale, CA (US)

( * ) Notice: Subject to any disclaimer, the term of this patent is extended or adjusted under 35 U.S.C. 154(b) by 172 days.

(21) Appl. No.: 13/069,837

(22) Filed: Mar. 23, 2011

(65) Prior Publication Data

US 2011/0253668 A1 Oct. 20, 2011

Related U.S. Application Data

(60) Provisional application No. 61/316,770, filed on Mar. 23, 2010, provisional application No. 61/391,564, filed on Oct. 8, 2010.

(51) Int. Cl.
| | | |
|---|---|---|
| H01B 13/00 | (2006.01) | |
| H05K 3/06 | (2006.01) | |
| B82Y 10/00 | (2011.01) | |
| H01B 1/22 | (2006.01) | |
| H01L 31/0224 | (2006.01) | |
| H05K 1/09 | (2006.01) | |

(52) U.S. Cl.
CPC . *H05K 3/06* (2013.01); *B82Y 10/00* (2013.01); *H01B 1/22* (2013.01); *H01L 31/022466* (2013.01); *H05K 1/097* (2013.01); *H05K 2201/026* (2013.01)

(58) Field of Classification Search
None
See application file for complete search history.

(56) References Cited

U.S. PATENT DOCUMENTS

| 4,448,637 | A | * | 5/1984 | Hiraishi et al. | 216/23 |
|---|---|---|---|---|---|
| 5,391,235 | A | * | 2/1995 | Inoue | 136/244 |
| 5,688,366 | A | | 11/1997 | Ichinose et al. | 156/662.1 |
| 6,975,067 | B2 | | 12/2005 | McCormick et al. | 313/512 |
| 7,793,402 | B2 | | 9/2010 | Barringer et al. | 29/505 |
| 7,849,424 | B2 | | 12/2010 | Wolk et al. | 716/3 |
| 2006/0264049 | A1 | | 11/2006 | Ittel | 438/689 |
| 2007/0074316 | A1 | | 3/2007 | Alden et al. | 977/762 |
| 2008/0121621 | A1 | | 5/2008 | Stockum et al. | 216/97 |
| 2008/0143906 | A1 | | 6/2008 | Allemand et al. | 349/43 |
| 2008/0210052 | A1 | | 9/2008 | Allemand | 75/300 |
| 2008/0210660 | A1 | | 9/2008 | Stockum et al. | |
| 2008/0259262 | A1 | | 10/2008 | Jones et al. | 349/139 |

(Continued)

FOREIGN PATENT DOCUMENTS

| JP | 2008-547232 A | 12/2008 |
|---|---|---|
| JP | 2010/140859 A | 6/2010 |
| WO | 2011/106438 | 9/2011 |

OTHER PUBLICATIONS

Kado et al.; Etching process involves etching laminated film containing silver or its alloy using etching solution containing mixture of phosphoric, nitric and acetic acids with preset flow rate; Derwent 2003-358383.*

(Continued)

*Primary Examiner* — Duy Deo
(74) *Attorney, Agent, or Firm* — Seed IP Law Group PLLC

(57) ABSTRACT

A patterned transparent conductor including a conductive layer coated on a substrate is described. More specifically, the transparent conductor can be patterned by screen-printing an acidic etchant formulation on the conductive layer. A screen-printable etchant formulation is also disclosed.

9 Claims, 4 Drawing Sheets

(56) References Cited

U.S. PATENT DOCUMENTS

| | | | |
|---|---|---|---|
| 2009/0052029 A1 | 2/2009 | Dai et al. | 359/486 |
| 2009/0223703 A1 | 9/2009 | Winoto | 174/257 |
| 2009/0283304 A1 | 11/2009 | Winoto | 174/257 |
| 2009/0321113 A1 | 12/2009 | Allemand et al. | 174/257 |
| 2010/0243295 A1 | 9/2010 | Allemand et al. | 174/250 |
| 2010/0307792 A1 | 12/2010 | Allemand et al. | 174/126.1 |
| 2011/0024159 A1 | 2/2011 | Allemand et al. | 174/126.1 |
| 2011/0042126 A1 | 2/2011 | Spaid et al. | 174/250 |
| 2011/0045272 A1 | 2/2011 | Allemand | 428/292.1 |
| 2011/0048170 A1 | 3/2011 | Bhatia et al. | 75/330 |
| 2011/0061908 A1 | 3/2011 | Goto et al. | 174/257 |
| 2011/0163403 A1 | 7/2011 | Bhatia et al. | 257/432 |
| 2011/0230053 A1* | 9/2011 | Matsuda et al. | 438/745 |
| 2011/0297642 A1* | 12/2011 | Allemand et al. | 216/13 |

OTHER PUBLICATIONS

Sun et al., "Crystalline Silver Nanowires by Soft Solution Processing," *Nano Letters* 2(2):165-168, 2002.

Sun et al., "Polyol Synthesis of Uniform Silver Nanowires: A Plausible Growth Mechanism and the Supporting Evidence," *Nano Letters* 3(7):955-960, 2003.

Sun et al., "Uniform Silver Nanowires Synthesis by Reducing $AgNO_3$ with Ethylene Glycol in the Presence of Seeds and Poly(Vinyl Pyrrolidone)," *Chem. Mater.* 14:4736-4745, 2002.

\* cited by examiner

ETCH PATTERNING OF NANOSTRUCTURE TRANSPARENT CONDUCTORS

CROSS-REFERENCES TO RELATED APPLICATIONS

This application claims the benefit under 35 U.S.C. §119 (e) of U.S. Provisional Patent Application No. 61/316,770 filed Mar. 23, 2010, and U.S. Provisional Patent Application No. 61/391,564 filed Oct. 8, 2010; these provisional applications are incorporated herein by reference in their entireties.

BACKGROUND

Description of the Related Art

Transparent conductors refer to thin conductive films coated on high-transmittance surfaces or substrates. Transparent conductors may be manufactured to have surface conductivity while maintaining reasonable optical transparency. Such surface conducting transparent conductors are widely used as transparent electrodes in flat liquid crystal displays, touch panels, electroluminescent devices, and thin film photovoltaic cells, as anti-static layers and as electromagnetic wave shielding layers.

Currently, vacuum deposited metal oxides, such as indium tin oxide (ITO), are the industry standard materials to provide optically transparency and electrical conductivity to dielectric surfaces such as glass and polymeric films. However, metal oxide films are fragile and prone to damage during bending or other physical stresses. They also require elevated deposition temperatures and/or high annealing temperatures to achieve high conductivity levels. For certain substrates that are prone to adsorbing moisture such as plastic and organic substrates (e.g., polycarbonates), it may be problematic for a metal oxide film to adhere properly. Applications of metal oxide films on flexible substrates are therefore severely limited. In addition, vacuum deposition is a costly process and requires specialized equipment. Moreover, the process of vacuum deposition is not conducive to forming patterns and circuits. This typically results in the need for expensive patterning processes such as photolithography.

Conductive polymers have also been used as optically transparent electrical conductors. However, they generally have lower conductivity values and higher optical absorption (particularly at visible wavelengths) compared to the metal oxide films, and may lack chemical and long-term stability.

Accordingly, there remains a need in the art to provide transparent conductors having desirable electrical, optical and mechanical properties, in particular, transparent conductors that are adaptable to any substrates, and can be manufactured and patterned in a low-cost, high-throughput process.

BRIEF SUMMARY

A patterned transparent conductor including a conductive layer coated on a substrate is described. More specifically, the transparent conductor can be patterned by screen-printing an etchant formulation on the conductive layer. Thus, one embodiment is directed to a method for patterning a transparent conductor comprising: (1) providing a transparent conductor including a plurality of interconnected metal nanowires; (2) screen-printing an acidic etchant on the transparent conductor according to a pattern; and (3) providing a patterned transparent conductor by etching according to the pattern, the pattern defining an etched region and unetched region.

In a further embodiment, the method further comprises washing the patterned transparent conductor with an alkaline solution.

In a further embodiment, a screen-printable etchant formulation is described, which is suitable for being printed directly on a transparent conductor, which can be developed into a patterned conductor. More specifically, the screen-printable etchant comprises: (1) one or more acids; (2) an acid-resistant polymer; (3) a polar solvent; wherein the screen-printable etchant formulation has a viscosity in the range of 5,000-150,000 cP.

In further embodiments, the screen-printable etchant further comprises a metal halide.

In various embodiments, the acid-resistant polymer is polyamide or poly(2-acrylamido-2-methyl-1-propanesulfonic acid).

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION

Figure 1:
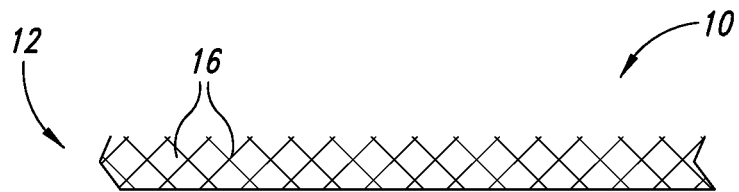
FIG. 1 shows an example of a transparent conductor comprising a conductive layer of nanostructures coated on a substrate.

Certain embodiments describe methods of patterning nanostructure transparent conductor which may include a sparse network of metal nanowires.

Conductive Nanostructures

As used herein, "conductive nanostructures" or "nanostructures" generally refer to electrically conductive nano-sized structures, at least one dimension of which (i.e., width or diameter) is less than 500 nm, and more typically less than 100 nm or 50 nm. In various embodiments, the width or diameter of the nanostructures are in the range of 10 to 40 nm, 20 to 40 nm, 5 to 20 nm, 10 to 30 nm, 40 to 60 nm, 50 to 70 nm.

The nanostructures can be of any shape or geometry. One way for defining the geometry of a given nanostructure is by its "aspect ratio," which refers to the ratio of the length and the width (or diameter) of the nanostructure. In certain embodiments, the nanostructures are isotropically shaped (i.e., aspect ratio=1). Typical isotropic or substantially isotropic nanostructures include nanoparticles. In preferred embodiments, the nanostructures are anisotropically shaped (i.e., aspect ratio≠1). The anisotropic nanostructure typically has a longitudinal axis along its length. Exemplary anisotropic nanostructures include nanowires (solid nanostructures having aspect ratios of at least 10, and more typically at least 50), nanorod (solid nanostructures having aspect ratio of less than 10) and nanotubes (hollow nanostructures).

Lengthwise, anisotropic nanostructures (e.g., nanowires) are more than 500 nm, or more than 1 μm, or more than 10 μm in length. In various embodiments, the lengths of the nanostructures are in the range of 5 to 30 μm, or in the range of 15 to 50 μm, 25 to 75 μm, 30 to 60 μm, 40 to 80 μm, or 50 to 100 μm.

The nanostructures can be of any conductive material. More typically, the nanostructures are formed of a metallic material, including elemental metal (e.g., transition metals) or a metal compound (e.g., metal oxide). The metallic material can also be a bimetallic material or a metal alloy, which comprises two or more types of metal. Suitable metals include, but are not limited to, silver, gold, copper, nickel, gold-plated silver, platinum and palladium. It should be noted that although the present disclosure describes primarily nanowires (e.g., silver nanowires), any nanostructures within the above definition can be equally employed.

Suitable nanowires typically have aspect ratios in the range of 10 to 100,000. Larger aspect ratios can be favored for obtaining a transparent conductor layer since they may enable more efficient conductive networks to be formed while permitting lower overall density of wires for a high transparency. In other words, when conductive nanowires with high aspect ratios are used, the density of the nanowires that achieves a conductive network can be low enough that the conductive network is substantially transparent.

Conductive nanowires include metal nanowires and other conductive particles having high aspect ratios (e.g., higher than 10). Examples of non-metallic nanowires include, but are not limited to, carbon nanotubes (CNTs), metal oxide nanowires, conductive polymer fibers and the like.

As used herein, "metal nanowire" refers to a metallic wire comprising elemental metal, metal alloys or metal compounds (including metal oxides). At least one cross-sectional dimension of the metal nanowire is less than 500 nm, and less than 200 nm, and more preferably less than 100 nm. As noted above, the metal nanowire has an aspect ratio (length:diameter) of greater than 10, preferably greater than 50, and more preferably greater than 100. Suitable metal nanowires can be based on any metal, including without limitation, silver, gold, copper, nickel, and gold-plated silver.

The metal nanowires can be prepared by known methods in the art. In particular, silver nanowires can be synthesized through solution-phase reduction of a silver salt (e.g., silver nitrate) in the presence of a polyol (e.g., ethylene glycol) and poly(vinyl pyrrolidone). Large-scale production of silver nanowires of uniform size can be prepared according to the methods described in, e.g., Xia, Y. et al., *Chem. Mater.* (2002), 14, 4736-4745, and Xia, Y. et al., *Nanoletters* (2003) 3(7), 955-960.

Conductive Layer and Substrate

As an illustrative example, FIG. 1 shows a transparent conductor 10 comprising a conductive layer 12 coated on a substrate 14. The conductive layer 12 comprises a plurality of metal nanowires 16. The metal nanowires 16 form a conductive network.

Figure 2:
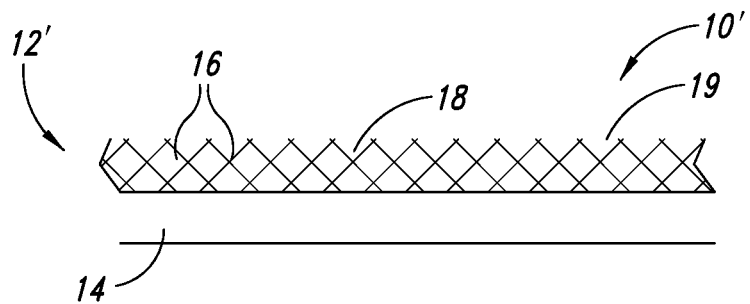
FIG. 2 shows an example of a transparent conductor which includes a plurality of metal nanowires embedded in a matrix.

FIG. 2 shows another example of a transparent conductor 10', in which a conductive layer 12' is formed on the substrate 14. The conductive layer 12' includes a plurality of metal nanowires 16 embedded in a matrix 18.

"Matrix," which in certain circumstances is also referred to as "binder," refers to a solid-state material into which the metal nanowires are dispersed or embedded. Portions of the nanowires may protrude from the matrix material to enable access to the conductive network. The matrix is a host for the metal nanowires and provides a physical form of the conductive layer. The matrix protects the metal nanowires from adverse environmental factors, such as corrosion and abrasion. In particular, the matrix significantly lowers the permeability of corrosive elements in the environment, such as moisture, trace amounts of acids, oxygen, sulfur and the like.

In addition, the matrix offers favorable physical and mechanical properties to the conductive layer. For example, it can provide adhesion to the substrate. Furthermore, unlike metal oxide films, polymeric or organic matrices embedded with metal nanowires are robust and flexible. As will be discussed in more detail herein, flexible matrices make it possible to fabricate transparent conductors in a low-cost and high-throughput process.

Moreover, the optical properties of the conductive layer can be tailored by selecting an appropriate matrix material. For example, reflection loss and unwanted glare can be effectively reduced by using a matrix of a desirable refractive index, composition and thickness.

Typically, the matrix is an optically clear material. A material is considered "optically clear" or "optically transparent", if the light transmission of the material is at least 80% in the visible region (400 nm-700 nm). Unless specified otherwise, all the layers (including the substrate and the nanowire network layer) in a transparent conductor described herein are preferably optically clear. The optical clarity of the matrix is typically determined by a multitude of factors, including without limitation: the refractive index (RI), thickness, consistency of RI throughout the thickness, surface (including interface) reflection, and haze (a scattering loss caused by surface roughness and/or embedded particles).

In certain embodiments, the matrix is about 10 nm to 5 μm thick, about 20 nm to 1 μm thick, or about 50 nm to 200 nm thick. In other embodiments, the matrix has a refractive index of about 1.3 to 2.5, or about 1.35 to 1.8.

In certain embodiments, the matrix is a polymer, which is also referred to as a polymeric matrix. Optically clear polymers are known in the art. Examples of suitable polymeric matrices include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g., polypropylene, polymethylpentene, and cyclic olefins), acrylonitrile-butadiene-styrene copolymer (ABS), cellulosics, silicones and other silicon-containing polymers (e.g., polysilsesquioxanes and polysilanes), polyvinylchloride (PVC), polyacetates, polynorbornenes, synthetic rubbers (e.g., EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), amorphous fluorocarbon polymers or copolymers (e.g., CYTOP® by Asahi Glass Co., or Teflon® AF by DuPont), and cellulosic material such as carboxy methyl cellulose (CMC), 2-hydroxy ethyl cellulose (HEC), hydroxy propyl methyl cellulose (HPMC), methyl cellulose (MC).

In other embodiments, the polymeric matrix described herein comprises partially polymerized or partially cured polymer. Compared to a fully polymerized or fully cured matrix, a partially cured matrix has a lesser degree of cross-linking and/or polymerization and lower molecular weight. Thus, the partially polymerized matrix can be etched under certain conditions and patterning is possible using conventional photolithography. Under a proper polymerization condition, the partially cured matrix may be further cured whereby further cross-linking and polymerization are carried out to provide a matrix of higher molecular weight than that of a partially cured matrix. The partially cured matrix can be etched, followed by a further curing step, to provide a patterned and fully-cured transparent conductor film. Examples of suitable partially cured polymers include, but are not limited to partially cured acrylate, silicone-epoxy, siloxane, novolac, epoxy, urethane, silsesquioxane or polyimide.

One skilled in the art would recognize that the degree of polymerization may impact the etching condition (solution) under which the partially polymerized matrix and/or nanowires can dissolve. Typically, the higher the degree of polymerization, the more difficult it is to etch the matrix.

Preferably, the partially cured matrix has an acceptable degree of physical integrity to protect the nanowires within. This is desirable because an end-user may carry out his own patterning and the subsequent curing to obtain a final transparent conductor film.

In further embodiments, the matrix is an inorganic material. For example, a sol-gel matrix based on silica, mullite, alumina, SiC, MgO—$Al_2O_3$—$SiO_2$, Al2O3—$SiO_2$, MgO—$Al_2O_3$—$SiO_2$—$Li_2O$ or a mixture thereof can be used.

In certain embodiments, the matrix itself is conductive. For example, the matrix can be a conductive polymer. Conductive polymers are well known in the art, including without limitation: poly(3,4-ethylenedioxythiophene) (PEDOT), polyanilines, polythiophenes, and polydiacetylenes.

"Conductive layer", or "conductive film", refers to a network layer of metal nanowires that provide the conductive media of the transparent conductor. When a matrix is present, the combination of the network layer of metal nanowires and the matrix is also referred to as a "conductive layer". Since conductivity is achieved by electrical charge percolating from one metal nanowire to another, sufficient metal nanowires must be present in the conductive layer to reach an electrical percolation threshold and become conductive. The conductivity of the conductive layer is inversely proportional to its resistivity, sometimes referred to as sheet resistance, which can be measured by known methods in the art.

Likewise, when a matrix is present, the matrix must be filled with sufficient metal nanowires to become conductive. As used herein, "threshold loading level" refers to a percentage of the metal nanowires by weight after loading of the conductive layer at which the conductive layer has a surface resistivity or in-plane resistivity of no more than about $10^6$ ohm/square (or $\Omega/\square$). More typically, the surface resistivity is no more than $10^5 \Omega/\square$, no more than $10^4 \Omega/\square$, no more than $1,000 \Omega/\square$, no more than $500 \Omega/\square$, or no more than $100 \Omega/\square$. The threshold loading level depends on factors such as the aspect ratio, the degree of alignment, the degree of agglomeration and the resistivity of the metal nanowires.

As is understood by one skilled in the art, the mechanical and optical properties of the matrix are likely to be altered or compromised by a high loading of any particles therein. Advantageously, the high aspect ratios of the metal nanowires allow for the formation of a conductive network through the matrix at a threshold surface loading level preferably of about $0.05\ \mu g/cm^2$ to about $10\ \mu g/cm^2$, more preferably from about $0.1\ \mu g/cm^2$ to about $5\ \mu g/cm^2$ and more preferably from about $0.8\ \mu g/cm^2$ to about $3\ \mu g/cm^2$ for silver nanowires. These loading levels do not affect the mechanical or optical properties of the matrix. These values depend strongly on the dimensions and spatial dispersion of the nanowires. Advantageously, transparent conductors of tunable electrical conductivity (or surface resistivity) and optical transparency can be provided by adjusting the loading levels of the metal nanowires.

Figure 3:
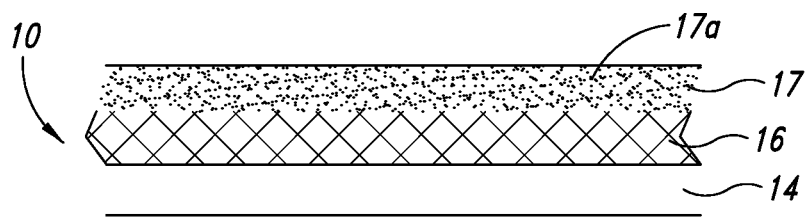
FIG. 3 shows a further example of a nanowire-based transparent conductor having an overcoat layer, which has a plurality of conductive particles embedded therein.

In certain embodiments, surface conductivity in the overcoat can be established by incorporating a plurality of nano-sized conductive particles in the overcoat. As shown in FIG. 3, a nanowire-based conductive layer 10 is deposited on substrate 14. The conductive layer 10 comprises nanowires 16 which reach the percolation threshold and establish in-plane conductivity. An overcoat 17 is formed on the conductive layer 10. A plurality of conductive particles 17a is embedded in the overcoat 17. Advantageously, the loading level of the nano-sized conductive particles in the overcoat does not need to reach the percolation threshold to exhibit surface conductivity. The conductive layer remains as the current-carrying medium, in which the nanowires have reached electrical percolation level. The conductive particles in the overcoat provide for surface conductivity as a result of their contacts with the underlying nanowires through the thickness of the overcoat.

Thus, one embodiment provides a multi-layer structure comprising: a substrate; a conductive layer formed on the substrate, wherein the conductive layer comprises a first plurality of metallic nanowires, the first plurality of metallic nanowires reaching an electrical percolation level; and an overcoat formed on the conductive layer, the overcoat incorporating a second plurality of conductive particles, the second plurality of conductive particles being below the electrical percolation level.

As used herein, nano-sized conductive particles refer to conductive particles having at least one dimension that is no more than 500 nm, and more typically no more than 200 nm. Examples of suitable conductive particles include, but are not limited to, ITO, ZnO, doped ZnO, metallic nanowires (including those described herein), metallic nanotubes, carbon nanotubes (CNT) and the like.

"Substrate", or "substrate of choice", refers to a material onto which the conductive layer is coated or laminated. The substrate can be rigid or flexible. The substrate can be clear or opaque. The term "substrate of choice" is typically used in connection with a lamination process, as will be discussed herein. Suitable rigid substrates include, for example, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Typically, the optical transparence or clarity of the conductive layer can be quantitatively defined by parameters including light transmission and haze. "Light transmission" (or "light transmissivity") refers to the percentage of an incident light transmitted through a medium. In various embodiments, the light transmission of the conductive layer is at least 80% and can be as high as 98%. For a transparent conductor in which the conductive layer is deposited or laminated on a substrate, the light transmission of the overall structure may be slightly diminished. Performance-enhancing layers, such as an adhesive layer, an anti-reflective layer, an anti-glare layer, may further contribute to reducing the overall light transmission of the transparent conductor. In various embodiments, the light transmission ("T %") of the transparent conductors can be at least 50%, at least 60%, at least 70%, or at least 80% and may be as high as at least 91% to 92%, or at least 95%.

Haze ("H %") is an index of light diffusion. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. Typically, haze of a conductive film can be significantly impacted by the diameters of the nanostructures. Nanostructures of larger diameters (e.g., thicker nanowires) are typically associated with a higher haze. In various embodiments, the haze of the transparent conductor is no more than 10%, no more than 8%, or no more than 5% and may be as low as no more than 2%, no more than 1%, no more than 0.5%, or no more than 0.25%.

Nanowire Deposition and Transparent Conductor Fabrication

In certain embodiments, it is thus described herein a method of fabricating a transparent conductor comprising: depositing a plurality of metal nanowires on a substrate, the metal nanowires being dispersed in a fluid; and forming a metal nanowire network layer on the substrate by allowing the fluid to dry.

The metal nanowires can be prepared as described above. The metal nanowires are typically dispersed in a liquid to facilitate the deposition. It is understood that, as used herein, "deposition" and "coating" are used interchangeably. Any non-corrosive liquid in which the metal nanowires can form a stable dispersion (also called "metal nanowires dispersion") can be used. Preferably, the metal nanowires are dispersed in water, an alcohol, a ketone, ethers, hydrocarbons or an aromatic solvent (benzene, toluene, xylene, etc.). More preferably, the liquid is volatile, having a boiling point of no more than 200° C., no more than 150° C., or no more than 100° C.

In addition, the metal nanowire dispersion may contain additives and binders to control viscosity, corrosion, adhesion, and nanowire dispersion. Examples of suitable additives and binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl® FSN, Zonyl® FSO, Zonyl® FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, and hydroxy ethyl cellulose. Examples of suitable solvents include water and isopropanol.

The nanowire concentration in the dispersion can affect or determine parameters such as thickness, conductivity (including surface conductivity), optical transparency, and mechanical properties of the nanowire network layer. The percentage of the solvent can be adjusted to provide a desired concentration of the nanowires in the dispersion. In preferred embodiments the relative ratios of the other ingredients, however, can remain the same. In particular, the ratio of the surfactant to the viscosity modifier is preferably in the range of about 80 to about 0.01; the ratio of the viscosity modifier to the metal nanowires is preferably in the range of about 5 to about 0.000625; and the ratio of the metal nanowires to the surfactant is preferably in the range of about 560 to about 5. The ratios of components of the dispersion may be modified depending on the substrate and the method of application used. The preferred viscosity range for the nanowire dispersion for deposition is between about 1 and 100 cP.

Following the deposition, the liquid is removed by evaporation. The evaporation can be accelerated by heating (e.g., baking). The resulting nanowire network layer may require post-treatment to render it electrically conductive. This post-treatment can be a process step involving exposure to heat, plasma, corona discharge, UV-ozone, or pressure as described below.

In certain embodiments, it is thus described herein a method of fabricating a transparent conductor comprising: depositing a plurality of metal nanowires on a substrate, the metal nanowires being dispersed in a fluid; forming a metal nanowire network layer on the substrate by allowing the fluid to dry, coating a matrix material on the metal nanowire network layer, and curing the matrix material to form a matrix.

"Matrix material" refers to a material or a mixture of materials that can cure into the matrix, as defined herein. "Cure", or "curing", refers to a process where monomers or partial polymers (fewer than 150 monomers) polymerize and/or cross-link so as to form a solid polymeric matrix. Suitable polymerization conditions are well known in the art and include, by way of example, heating the monomer, irradiating the monomer with visible or ultraviolet (UV) light, electron beams, and the like. In addition, "solidification" of a polymer/solvent system simultaneously caused by solvent removal is also within the meaning of "curing".

The degree of curing can be controlled by selecting the initial concentrations of monomers and the amount of the cross-linkers. It can be further manipulated by adjusting curing parameters such as the time allowed for the polymerization and the temperature under which the polymerization takes place, and the like. In certain embodiments, the partially cured matrix can be quenched in order to arrest the curing process. The degree of curing or polymerization can be monitored, for example, by the molecular weight of the curing polymer or by the optical absorbance at wavelengths indicative of the reactive chemical species.

Thus, in certain embodiments, the matrix material comprises a polymer, which may be fully or partially cured. Optically clear polymers are known in the art. Examples of suitable polymeric matrices include, but are not limited to:

polyacrylates (or "acrylates") such as polymethacrylates, polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, silicone-epoxy, polyolefins (e.g., polypropylene, polymethylpentene, and cyclic olefins), acrylonitrile-butadiene-styrene copolymer (ABS), cellulosics, silicones and other silicon-containing polymers (e.g., polysilsesquioxanes and polysilanes), silicone-siloxane, polyvinylchloride (PVC), polyacetates, polynorbornenes, synthetic rubbers (e.g., EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by DuPont).

In other embodiments, the matrix material comprises a prepolymer. A "prepolymer" refers to a mixture of monomers or a mixture of oligomers or partial polymers that can polymerize and/or crosslink to form the polymeric matrix, as described herein. It is within the knowledge of one skilled in the art to select, in view of a desirable polymeric matrix, a suitable monomer or partial polymer.

In a preferred embodiment, the prepolymer is photo-curable, i.e., the prepolymer polymerizes and/or cross-links upon exposure to irradiation. As will be described in more detail, matrices based on photo-curable prepolymers can be patterned by exposure to irradiation in selective regions. In other embodiments, the prepolymer is thermal-curable, which can be patterned by selective exposure to a heat source.

Typically, the matrix material is a liquid. The matrix material may optionally comprise a solvent. Any non-corrosive solvent that can effectively solvate or disperse the matrix material can be used. Examples of suitable solvents include water, an alcohol, a ketone, tetrahydrofuran, hydrocarbons (e.g., cyclohexane) or an aromatic solvent (benzene, toluene, xylene, etc.). More preferably, the solvent is volatile, having a boiling point of no more than 200° C., no more than 150° C., or no more than 100° C.

In certain embodiments, the matrix material may comprise a cross-linker, a polymerization initiator, stabilizers (including, for example, antioxidants, and UV stabilizers for longer product lifetime and polymerization inhibitors for greater shelf-life), surfactants and the like. In other embodiments, the matrix material may further comprise a corrosion inhibitor.

As noted herein, the transparent conductors can be fabricated by, for example, sheet coating, web-coating, printing, and lamination.

Fabrication of transparent conductors from conductive nanostructures is disclosed in, for example, U.S. patent application Ser. No. 11/871,767, which is incorporated by reference in its entirety herein.

Patterning

A conductive layer can be patterned by etching. Depending on the composition of the conductive layer, various etching solutions, or "etchants," can be used to dissolve and remove portions of the conductive layer in the unmasked areas. Etchants may be applied to a transparent conductor to be patterned in any known method, including using a predetermined patterned mask or screen printing the etchant in a predetermined pattern.

In one embodiment, an acid-etching solution comprising nitric acid ($HNO_3$) can be used. Typically, the nitric acid is present at 0.01%-40%, more typically, the nitric acid is present at 0.01%-10%. The acid-etching solution may further comprise a trace amount (e.g., about 1-100 ppm) of potassium permanganate ($KMnO_4$). In one embodiment, the acid-etching solution comprises about 1% $HNO_3$, 1% $NaNO_3$ and a trace amount (several parts per million) of potassium permanganate ($KMnO_4$). The etching solution converts metal nanowires to soluble metal salt, which can be removed by washing. For example, silver nanowires can be converted to silver salt ($Ag^+$), which can be rinsed off by a solvent, e.g., water.

In certain embodiments, the etching solution does not affect or dissolve a matrix composed of fully or partially cured polymer. Patterning can be carried out by depositing and curing a polymeric matrix material on a nanowire layer according to a desired pattern. Once the matrix is cured (either fully or partially) to attain an acceptable degree of hardness and physical form, the matrix protects the nanowires embedded therein from being etched away during a subsequent etching step. The nanowires in the unprotected areas (where the matrix material is not polymerized or where no matrix is present) can be etched and removed. Thus, one embodiment describes a method of patterning, the method comprising: forming a conductive layer on a substrate, the conductive layer comprising a plurality of nanowires; forming a matrix on the conductive layer according to a pattern, the pattern comprising nanowires protected by a matrix and unprotected nanowires; and etching the conductive layer to dissolve the unprotected nanowires. The unprotected nanowires can be either removed or left in place.

It has been found that the amount of $KMnO_4$ in the acid-etching solution described herein can impact the etching power. For example, the amount of $KMnO_4$ in the acid etching solution can affect the rate of etching. Typically, higher concentration of $KMnO_4$ results in faster etching. Accordingly, adjusting the concentration of $KMnO_4$ in the acid etching solution can modulate the etching efficiency without changing the acidity of the etching solution.

It has also been observed that higher concentration of $KMnO_4$ in the acid etching solution may cause more effective diffusion of the etching solution into the matrix, which results in faster or more complete dissolution of the nanowires in situ. For example when $KMnO_4$ is present in the etching solution at less than 20 ppm, the matrix (of a standard thickness of about 150 nm) can protect the nanowires embedded therein from being etched. When the amount of $KMnO_4$ is increased to about 20 ppm, while the concentrations of $HNO_3$ and $NaNO_3$ remain constant, the etching solution diffuses into the matrix (about 150 nm thick) and dissolves the nanowires embedded therein.

A thick overcoat (about 1 μm) can effectively prevent the diffusion of an acid-etching solution and protect the nanowire from being etched, while the nanowire/matrix unprotected by the thick overcoat was dissolved by the acid-etching solution (e.g., 20 ppm $KMnO_4$, 1% $HNO_3$ and 1% $NaNO_3$.)

Thus, in one embodiment, an etching solution can be selected that is capable of diffusing into the matrix and dissolving the nanowires. In these embodiments, conductive layers comprising nanowires in a matrix can be etched by using a protective mask (e.g., a photoresist). Thus, patterning can be carried out according to standard photolithography methods, by which the nanowires in the unmasked region are etched.

In a further embodiment, etching the unmasked region comprises etching the matrix in the unmasked region using a first etchant; and etching the nanowires in the unmasked region using a second etchant. For example, a first etchant (e.g., hydrogen peroxide) can be used to remove the matrix to expose or deprotect the nanowires in the unmasked region. Thereafter, a second etchant, such as the acid-etching solution discussed herein, can be used to dissolve or remove the nanowires that are no longer protected by the matrix.

Thus, other embodiments describe a method of patterning the transparent conductor using a mask. The mask acts as a thick overcoat, protecting the nanowire/matrix layer underneath. The method comprises: forming a conductive layer on a substrate, the conductive layer comprising a matrix and a plurality of electrically conductive nanowires embedded therein; placing a mask on the conductive layer to define a masked region and an unmasked region; and etching the unmasked region using an acid-etching solution to form a patterned conductive region. The method may further comprise removing the etched region to form a pattern.

Other factors that can contribute to etching efficiency include, but are not limited to, the degree of curing of the matrix. For example, given the same etching solution and the same monomers, a matrix formed by partially cured polymer tends to dissolve more readily than a matrix formed by fully cured polymer. After patterning, the partially cured matrix may undergo an additional curing step to fully cure the matrix.

More efficient etching can also be achieved by activating an etching surface of the transparent conductor prior to etching. Such a pre-treatment is particularly beneficial to a wet-etching process, in which a liquid etchant comes into contact with the etching surface of the transparent conductor. Typically, the etching surface of the transparent conductor can be a top surface of the nanowire/matrix layer or, in some instances, a top surface of an overcoat layer. The matrix layer and the overcoat layer protect the underlying nanowires from corrosive elements and abrasion. Their presence, however, may cause poor wetting of the liquid etchant. Pre-treating the etching surface of the transparent conductor can activate the surface and improve its wetting behavior. As a result, the liquid etchant can gain access to the metal nanowires protected by the matrix and/or the overcoat layer.

Thus, the method of patterning described above can further comprise pre-treating an etching surface of the conductive layer to improve its wetting behavior.

The change in the wetting behavior can be assessed by water contact angle measurements. Water contact angle refers to the angle at which a liquid/vapor interface meets a solid surface (i.e., the etching surface). Typically, a higher water contact angle is correlated with poorer wetting of the solid surface. As shown in Table 1, depending on the types of treatment, the water contact angles are substantially reduced by about 50% to 80% after surface treatments.

TABLE 1

| Surface Treatment | Water Contact Angle (°) | |
| --- | --- | --- |
| | without surface treatment | With surface treatment |
| Oxygen Plasma | 62.4 | 12.5 |
| UV ozone | 63.5 | 34.5 |

Using etchants of the same strength, the rate of etching surface-treated transparent conductors can be significantly improved as compared to the rate of etching untreated transparent conductors. Accordingly, transparent conductor films can be efficiently patterned by pre-treating the regions to be etched.

Moreover, by adjusting the types and/or strength of the etchants, it is possible to create a patterned transparent conductor film with substantially uniform optical properties or low-visibility patterns. These transparent conductors with low-visibility patterns are particularly useful as components in displays such as touch screens.

As used herein, "substantially optically uniform," "optically uniform," or "optical uniformity" refers to an optical characteristic of a patterned transparent conductor film having at least two regions of distinctive conductivities, the ratio of the resistivity of the etched region over the resistivity of the unetched region being at least $10^3$, or at least $10^4$, or at least $10^5$, or at least $10^6$, wherein the difference between the light transmissions (T %) of the two regions is less than 5%, or less than 4%, or less than 3%, or less than 2%, or less than 1%, or less than 0.5% or zero; and wherein the difference between the haze values (H %) of the two regions is less than 0.5%, less than 0.1%, less than 0.07%, less than 0.05%, less than 0.03%, less than 0.01% or zero. This process, which minimizes or eliminates the optical differences between etched and unetched regions of a patterned conductive film, is also referred to as "low-visibility patterning." In these incidences, it is believed that the nanowires are not completely etched away or dissolved, yet the nanowire network in the etched region has been rendered less conductive than those in the unetched region. In contrast with the "low-visibility patterning" described herein, an etching process that substantially or entirely dissolves the conductive medium (e.g., metal nanowires) results in a substantially lowered haze in the etched region due to a reduction of light scattering, in which case the optical differences between the etched and unetched regions can be substantial enough that the etched pattern is more clearly visible.

Thus, in a further embodiment, a conductive layer can be patterned by creating a non-conductive region, or a region having an altered resistivity that is not necessarily non-conductive, without completely destroying or removing the nanowires. In this way, any change in optical characteristics (i.e., transmission and haze) of the etched region can be relatively minimal, yet the resistivity of the conductive medium (i.e., the interconnected nanowire network) is altered in the etched regions according to a predetermined pattern. More specifically, this embodiment provides a method comprising: forming a conductive layer on a substrate, the conductive layer comprising a matrix and a network of electrically conductive nanowires embedded therein; and treating a region of the conductive layer to alter the resistivity of the network of electrically conductive nanowires within the region, thereby forming a patterned conductive layer including a treated region having a first resistivity and an untreated region having a second resistivity. The treated region may be, but need not be, rendered non-conductive. As used herein, "non-conductive" refers to a surface resistivity of at least $10^6 \Omega/\square$. In certain embodiments, a ratio of first resistivity over the second resistivity is at least 1000 (i.e., the etched region is less conductive than the unetched region). In other embodiments, a ratio of first resistivity over the second resistivity is at least $10^4$, or at least $10^5$, or at least $10^6$.

In addition, disclosed is a transparent conductor including a substrate and a patterned conductive layer having a network of electrically conductive nanowires embedded in a matrix. The patterned conductive layer defines a first region of the transparent conductor in which the network has a first resistivity and a second region of the transparent conductor in which the network has a second resistivity. The change or difference in optical characteristics (i.e., transmission and haze) between the two regions is relatively small. For example, without limitation, the difference in the transmission and haze, respectively, of the first region differs from that of the second region by less than 0.7% and 0.62%, respectively, while the change in resistance between the two regions is greater than about 1500Ω/□.

As described herein, an optically clear conductive layer can be treated or etched according to the patterning method described herein without affecting the optical properties of the treated or etched region. As further illustrated Example 14, the change in optical properties, including transmission (T %) and haze (H %), was relatively small before and after the patterning step such that the etched patterns obtained have low visibility. In such an "invisible patterning" or "low-visibility patterning" method, the conductive layer remains optically uniform in appearance; but is conductive in the untreated (or un-etched) region according to a predetermined pattern, the treated or etched areas having been rendered nonconductive or having a different and lower conductivity. In the present embodiment, altering the resistivity of the nanowire network can be accomplished by, without limitation, destroying or degrading the electrical conductivity of the connections between the nanowires or rendering the nanowires themselves non-conductive. In one embodiment, treating the electrically conductive nanowire network comprises chemically transforming the electrically conductive nanowires to non-conductive nanowires or wires having higher resistivity. Such chemical transformation may include, for example, oxidation, sulfidation, or any other process that converts the underlying conductive material of the nanowire to an electrically insulating material. For example, conductive nanowires formed by elemental metal or metal alloys (e.g., silver) can be rendered non-conductive when the metal is converted to an electrically insulating and insoluble metal salt (e.g., silver chloride.) In this example, the elemental silver can be initially oxidized and converted to silver ion ($Ag^+$). The oxidation can be further driven to completion in the presence of an anion (e.g., $Cl^-$), with which the positively charged silver ion can form an insoluble salt (AgCl). Other examples of anions that readily precipitate metal ions into insoluble metal salts include, for example, bromide, iodide and sulfate.

Examples of suitable oxidizing agents include, but are not limited to, peroxides (e.g., hydrogen peroxide), persulfates (e.g., ammonium persulfate), peroxo compounds (e.g., sodium or potassium peroxodisulfate), halogens or halogen-based oxidizing salts (e.g., chlorine or hypochlorite salts), oxidizing metal salts (e.g., palladium, manganese, cobalt, copper or silver salts), organic oxidizing agents such as 7,7', 8,8'-tetracyanoquinodimethane (TCNQ), and gaseous oxidizing agents such as air, oxygen, ozone and the like.

In various embodiments, the concentration of the oxidizing agent, type of agent and time of exposure to the agent may determine the extent of the chemical transformation of the conductive layer. It is possible that a strong and/or more concentrated oxidizing agent may cause the nanowires and the matrix layer to dissolve.

In certain embodiments, in addition to, or instead of, transforming the underlying material of the nanowires from conductive to less conductive or non-conductive, it is also possible that the nanowires may be physically compromised. For example, the nanowires may become broken or shortened; thereby reducing the level of their interconnectivity. As a result, the overall resistivity of the treated region increases compared to the untreated region, in part due to the formation of the electrically insulating material and in part due to the breakdown of the interconnectivity among the nanowires. It is noted that such changes in the physical structures of the nanowires may occur on a microscopic level only, and thus would not affect the macroscopic appearance (e.g., the optical properties) of the conductive layer. Accordingly, the conductive layers described herein may be treated to form conductive patterns that are optically uniform, as defined herein.

One embodiment describes a patterned, optically uniform conductive film on a substrate; a conductive film on the substrate, the conductive film including a plurality of interconnecting nanostructures, wherein a pattern on the conductive film defines (1) an unetched region having a first resistivity, a first transmission and a first haze and (2) an etched region having a second resistivity, a second transmission and a second haze; and wherein the etched region is less conductive than the unetched region, and a ratio of the first resistivity over the second resistivity is at least 1000; the first transmission (T %) differs from the second transmission (T %) by less than 5%; and the first haze (H %) differs from the second haze (H %) by less than 0.5%.

In other various embodiments, the ratio of the first resistivity over the second resistivity is at least $10^4$, or at least $10^5$, or at least $10^6$.

In certain other embodiments, the first transmission (T %) differs from the second transmission (T %) by less than 4%, or less than 3%, or less than 2%, or less than 1%, or less than 0.5% or zero.

In further embodiments, the first haze (H %) differs from the second haze (H %) by less than 0.1%, less than 0.07%, less than 0.05%, less than 0.03%, less than 0.01% or zero.

An etchant is selected to create small cuts in metal nanostructures (e.g., silver nanowires) such that at least some nanostructures are broken down to shorter segments. Although the small cuts undermine the conductivity of the nanostructures and render the conductive film in the etched region non-conductive or less conductive, they do not significantly alter the optical properties (T % and/or H %) of the etched region as compared to those of the un-etched region.

Suitable etchants can be, for example, an aqueous solution of a metal chloride salt, such as copper (II) chloride ($CuCl_2$) or iron (III) chloride ($FeCl_3$). The etchant may further include a strong acid, such as hydrogen chloride or nitric acid. The respective concentrations of the etchant components can be adjusted. Typically, higher concentrations of the metal salt and/or the strong acid lead to higher rates of etching. In certain embodiments, an etchant solution includes (by w/w %) about 12% to 24% $CuCl_2$ and about 1.4% to 6.8% of HCl, and the remainder of the etchant solution is water. In other embodiments, an etchant solution includes w/w %) about 30% $FeCl_3$ and about 4% of HCl.

The extent of etching can be determined by the resistivity of the etched region. The etched region is generally less conductive than the unetched region. For example, the resistivity of the etched region can be at least twice, at least 5 times, at least 10 times, at least 100 times, at least 1000 times, at least $10^4$ times, at least $10^5$ times or at least $10^6$ times of the resistivity of the unetched region. Various extents of etching can be controlled through controlling the etching time and/or the strength (i.e., concentration) of the etchant. The temperature at which the etching takes place can also affect the rate and extent of etching. Typically, etching at higher temperatures results in higher etching rates. In various embodiments, the etching is carried out at between about 20° C. and 60° C.

In another embodiment, the low-visibility patterning process comprises an initial partial etching step and a subsequent heating step. More specifically, the process comprises: etching the conductive film according to a pattern to provide (1) an unetched region having a first intermediate resistivity, and (2) an etched region having a second intermediate resistivity, wherein a first ratio of the first intermediate resistivity over the second intermediate resistivity is less than 1000; and heating the conductive film such that the etched region has a first final resistivity and the unetched region has a second final resistivity, wherein a second ratio of the first final resistivity over the second final resistivity is at least 1000, and wherein the etched region and the unetched region are optically uniform.

In certain embodiments, the first ratio of intermediate resistivities following the partial etching step is less than 5, or less than 2, whereas the second ratio of final resistivities following the heating step is at least $10^4$, or at least $10^5 \Omega/\square$, or at least $10^6$. Thus, if to be combined with a heating step, the initial etching step may partially etch only to the extent that the subsequent heating step can complete the etching process. Compared to a complete etching, which etches to be fully non-conductive (e.g., having a resistivity of at least $10^6 \Omega/\square$), a partial etching causes less damage to the nanostructures, as reflected by lower intermediate resistivity than those of the final resistivity. As a result, a first ratio in resistivities between the (partially) etched and unetched regions is substantially smaller than what a complete etching would have accomplished (i.e., the second ratio). Nevertheless, the nanostructures are sufficiently damaged by the partial etching that they could be completely severed by the subsequent heating process, resulting in a second ratio of resistivities between the etched and unetched region that is larger than the first ratio.

This "etching by heating process" is likely due to an increased sensitivity of nanostructures to melting behavior as their dimensions get smaller (i.e., thinner) from the partial etching step. For example, the etching by the $CuCl_2$ solution decreases the nanowire diameter in very small areas along the length of the wires, and the nanowires thus damaged are particularly susceptible to complete break-downs by the "etching by heating process."

It is unexpected that the heating step causes the partially etched region less conductive or non-conductive since generally a heating step has the opposite effect on film conductivity. As described herein, a heating step may be employed as a post-treatment step to increase the film conductivity of a given sample. In a partially etched film, on the other hand, the damage created by the partial etching unexpectedly changes the sensitivity of nanostructures to melting behaviors, which renders the nanostructures susceptible to breakage, resulting in a decrease of film conductivity.

Advantageously, the etched and unetched regions of the patterned conductive film prepared by the "etching by heating process" are optically uniform, resulting in low-visibility patterns. It is believed that the partial etching thins the nanostructures to a lesser extent than a complete etching, thus resulting in less change in haze. Further, the additional heating step makes the process more robust. For instance, if for any reason the initial etching step is less effective than expected, the subsequent heating step can complete the process of making the etched region of the conductive film less conductive or non-conductive.

Optionally, a pre-treatment step can be carried out prior to forming an invisible pattern or low-visibility pattern by improving the wetting behavior of the etching surface and changing the surface energy. As discussed, oxygen plasma and UV ozone are examples of suitable pre-treatments.

Screen Printing

One method of applying any etchant formulation disclosed herein is by screen printing. As is understood by one of ordinary skill in the art, screen printing is a method of applying a coating solution (or "ink") to a substrate that uses a mesh or screen to support a stencil that generally includes one or more features that block the ink from passing through the screen to the substrate. Ink is forced through the screen by a roller, squeegee or other such device that is moved across the screen's surface, thus allowing the ink to be distributed on the substrate except in regions that correspond to the ink-blocking features of the stencil. In various embodiments, like ink, an etchant formulation can be screen-printed onto a substrate (e.g., a transparent conductor) to be etched. Thus, one embodiment provides a method comprising: (1) providing a transparent conductor including a plurality of interconnected metal nanowires, (2) screen-printing an acidic etchant on the transparent conductor according to a pattern; and (3) providing a patterned transparent conductor by etching according to the pattern, the pattern defining an etched region and unetched region.

In further embodiments, the acidic etchant is a screen-printable etchant formulation described herein. In other embodiments, the transparent conductor further includes a binder that embeds the interconnected metal nanowires.

In certain embodiments, the etched region is no longer conductive due to structural damage to the metal nanowires. In other embodiments, the etched region remains conductive but has a conductivity that is lower than that of the un-etched region.

In certain embodiments, etchants may be selected to provide a patterned transparent conductor that has a substantially optical uniform appearance. More specifically, the etched region and the unetched region have substantially the same optical transmission and haze. In particular, etchants that include a combination of an oxidizer and a halide salt are capable of creating "invisible" or "low visibility" patterns. See PCT/US2011/25941, in the name of Cambrios Technologies Inc., the assignee of the present application.

In another embodiment, the method further comprises annealing the transparent conductor.

In yet another embodiment, the method further comprises washing the patterned transparent conductor. In general, washing may include rinsing with one or more solvents (e.g., water), soaking in a solvent bath that includes one or more solvents, or pressurized spraying with one or more solvents. In one embodiment, the patterned transparent conductor is washed with a basic solution followed by a water wash. The basic or alkaline solution can be any solution that has pH>7. Such solutions include, for example and without limitation, alkaline metal hydroxides such as sodium hydroxide (NaOH), potassium hydroxide (KOH); ammonium hydroxide ($NH_4OH$); and organic bases including tertiary and quaternary amines (e.g., tetramethyl ammonium hydroxide and triethylamine). As demonstrated in Example 14, a base wash is capable of providing the patterned transparent conductor with an enhanced reliability and stability, as evidenced by much less shift in resistance after a same period of usage.

Etchant Formulations

Any of the etchants disclosed herein may be formulated into a screen-printable etchant in accordance with the present disclosure. Generally, and without limitation, screen-printable etchants in accordance with the present disclosure can include a polar solvent (e.g., water or an alcohol), one or more acids and may also optionally include one or more metal halides (including metal chlorides), one or more surfactants and one or more polymers.

The etchant is acidic owing to the presence of the one or more acids. Acids can include, without limitation, nitric acid ($HNO_3$), phosphoric acid ($H_3PO_4$), acetic acid (HOAc), and hydrochloric acid (HCl). Metal chlorides can include, without limitation, ferric chloride and copper chloride. The acidic etchant, either the acid(s) alone or the combination of the acid(s) and metal halide, etches the metal nanowires (with or without a binder) such that the metal nanowires are structurally compromised so that they are no longer conductive or are less conductive than the unetched metal nanowires. Typically, the etchant formulation comprises a total acid amount (including one or more acids) of about 10%-25%, or 25%-40%, or 40%-65%, or 40%-70%, or 45%-75% of the total weight of the etchant formulation.

In certain embodiments, the etchant formulation comprises nitric acid in an amount of 0.25%-1.25% (w/w), or 0.5%-2.5% (w/w), or 0.75%-3.75% (w/w), or 0.8%-4% (w/w), or 1-5% (w/w) of the etchant formulation.

In other embodiments, the etchant formulation comprises hydrochloride acid in an amount of 0.25%-1.25% (w/w), or 0.5%-2.5% (w/w), or 0.75%-3.75% (w/w), or 0.8%-4% (w/w), or 1-5% (w/w) of the etchant formulation.

Additives such as one or more surfactants and/or one or more polymers do not contribute to the etching chemically. However, they can be important in controlling or modulating the rheological behaviors and etching qualities of the etchant formulations. For instance, use of one or more surfactant additives in a screen-printable etchant formulation may reduce etch time, improve uniformity, reduce residue, and/or reduce dragout. Non-limiting examples of surfactants that may be used in a screen-printable etchant formulation includes Novec® 4300 available from 3M Corporation, Capstone® FS-10 and Capstone® FS-50, both available from DuPont Corporation.

Use of one or more polymer additive in a screen-printable etchant formulation can increase the viscosity of the etchant so that reflow is reduced and an etching pattern can be accurately reproduced. Preferably, the polymer used is acid resistant so that the polymer itself is not broken down. Non-limiting examples of polymers that may be used in a screen-printable etchant formulation include PolyAMPS, i.e., poly(2-acrylamido-2-methyl-1-propanesulfonic acid), and fine polyamide powders sold under Vestosint®2070 and Vestosint® 2159, available from Evonic Degussa Corporation. In various embodiments, the screen-printable etchant comprises at least 5% (w/w) of the polymer, or at least 10% (w/w) of the polymer, or at least 15% (w/w) of the polymer, or at least 20% (w/w) of the polymer. The screen-printable etchant has a viscosity typical of that of other known screen-printable materials. In certain embodiments, the screen-printable etchant has a viscosity in the range of 5,000-150,000 cP. In other embodiments, the screen-printable etchant has a viscosity in the range of 50,000-100,000 cP.

Additional etchants that can be formulated into screen-printable etchants include those described in PCT/US2011/25941. More specifically, the etchant includes an oxidizer and a halide. In more specific embodiments, the oxidizer is $FeCl_3$, $CuCl_2$, $HNO_3$, $I_2$, $H_2O_2$, or $O_2$, and the halide is a chloride or iodide. All combinations of the oxidizer and the halide are within the scope of this disclosure. In more specific embodiments, the etchant comprises $FeCl_3$ and HCl, or the etchant comprises $CuCl_2$ and HCl, or the etchant comprises $HNO_3$ and HCl. Acid-resistant polymers such as PolyAMPS and fine polyamide powders may be added to the formulation to adjust the viscosity.

The transparent conductor structures, their electrical and optical properties, and the methods of fabrication are illustrated in more detail by the following non-limiting examples.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g., Y. Sun, B. Gates, B. Mayers, & Y. Xia, "Crystalline silver nanowires by soft solution processing", *Nanoletters*, (2002), 2(2) 165-168. A modified polyol method, described in U.S. application Ser. No. 11/766,552, in the name of Cambrios Technologies Corporation, produces more uniform silver nanowires at higher yields than does the conventional "polyol" method. This application is incorporated by reference herein in its entirety.

Example 2

Preparation of a Transparent Conductor

An Autoflex EBG5 polyethylene terephthalate (PET) film 5 μm thick was used as a substrate. The PET substrate is an optically clear insulator. The light transmission and haze of the PET substrate are shown in Table 2. Unless specified otherwise, the light transmission was measured using the methodology in ASTM D1003.

An aqueous dispersion of silver nanowires was first prepared. The silver nanowires were about 70 nm to 80 nm in width and around 8 μm in length. The concentration of the silver nanowires (AgNW) was about 0.5% w/v of the dispersion, resulting in an optical density of about 0.5 (measured on a Molecular Devices Spectra Max M2 plate reader). The dispersion was then coated on the PET substrate by allowing the nanowires to sediment onto the substrate. As understood by one skilled in the art, other coating techniques can be employed, e.g., flow metered by a narrow channel, die flow, flow on an incline and the like. It is further understood that the viscosity and shear behavior of the fluid as well as the interactions between the nanowires may affect the distribution and interconnectivity of the nanowires coated.

Thereafter, the coated layer of silver nanowires was allowed to dry by water evaporation. A bare silver nanowire film, also referred to as a "network layer", was formed on the PET substrate. (AgNW/PET) The light transmission and haze were measured using a BYK Gardner Haze-gard Plus. The surface resistivity was measured using a Fluke 175 True RMS Multimeter. The results are shown in Table 2. The interconnectivity of the nanowires and an areal coverage of the substrate can also be observed under an optical or scanning electron microscope.

The matrix material was prepared by mixing polyurethane (PU) (Minwax Fast-Drying Polyurethane) in methyl ethyl ketone (MEK) to form a 1:4 (v/v) viscous solution. The matrix material was coated on the bare silver nanowire film by spin-coating. Other known methods in the art, for example, doctor blade, Meyer rod, draw-down or curtain coating, can be used. The matrix material was cured for about 3 hours at room temperature, during which the solvent MEK evaporated and the matrix material hardened. Alternatively, the curing can take place in an oven, e.g., at a temperature of 50° C. for about 2 hours.

A transparent conductor having a conductive layer on the PET substrate (AgNW/PU/PET) was thus formed. The conductive layer of the silver nanowires in the matrix was about 100 nm thick. Its optical and electrical properties were measured and the results are shown in Table 2.

The transparent conductor was further subjected to a tape test. More specifically, a 3M Scotch® 600 adhesive tape was firmly applied to the surface of the matrix and then removed, for example, by peeling. Any loose silver nanowires were removed along with the tape. After the tape test, the optical and electrical properties of the transparent conductor were measured and the results are shown in Table 2.

By way of comparison, a matrix-only film was formed on a PET substrate (PU/PET) under the same conditions as described above. The optical properties (light transmission and haze) and the electrical properties of the PU/PET are also provided in Table 2.

As shown in Table 2, the matrix-only film on PET (PU/PET) had a slightly higher light transmission as well as haze value than a PET substrate. Neither was conductive. By comparison, the bare silver nanowire film on PET was highly conductive, registering a surface resistivity of 60Ω/□. The deposition of the bare silver nanowire film on the PET lowered the light transmission and increased the haze. However, the bare silver nanowire film on PET was still considered optically clear with a light transmission of more than 80%. The optical and electrical properties of the bare silver nanowire film on PET were comparable or superior to metal oxide films (e.g., ITO) formed on PET substrates, which typically range from 60 to 400Ω/□.

As further shown in Table 2, the transparent conductor based on silver nanowires in the polyurethane matrix had an almost identical light transmission as the bare silver nanowire film on PET, and a slightly higher haze. The resistivity of the transparent conductor remained the same as the bare silver nanowire film, indicating that the coating of the matrix material did not disturb the silver nanowire film. The transparent conductor thus formed was optically clear, and had a comparable or superior surface resistivity to metal oxide films (e.g., ITO) formed on PET substrates.

In addition, the tape test did not alter the resistivity or the light transmission of the transparent conductor, and only slightly increased the haze.

TABLE 2

| Transparent Media | Light Transmission (%) | Haze (%) | Resistivity (Ω/□) |
|---|---|---|---|
| PET | 91.6 | 0.78 | non-conductive |
| PU/PET | 92.3 | 0.88 | non-conductive |
| AgNW/PET | 87.4 | 4.76 | 60 |
| AgNW/PU/PET | 87.2 | 5.74 | 60 |
| After tape test | 87.2 | 5.94 | 60 |

Example 3

Acid-Etching (1)

A conductive silver nanowires layer was first formed on a PET substrate. A UV-curable acrylate was deposited on the nanowire layer according to a pattern. The matrix was allowed to dry and partially cured. The matrix was typically about 50 nm-300 nm thick. Surface conductivity was detected in the areas protected by the matrix as well as in the areas unprotected by the matrix.

The transparent conductor sheet was then exposed to an acid-etching solution, which included 1% $HNO_3$, 1% $NaNO_3$ and 5 ppm of $KMnO_4$.

Within one minute, the etching of the silver nanowires had begun from a region adjacent to an area protected by the matrix. The dissolution and disruption of the nanowire layer was evident in the area unprotected by the matrix.

Two minutes into the etching, more unprotected silver nanowires were dissolved and a well-defined pattern emerged. At the end of four minutes, all the unprotected silver nanowires had been etched and removed by rinsing the transparent conductor sheet with water. The protected area remained conductive. Optionally, the partially cured matrix in the matrix protected area can be further cured.

Example 4

Acid-Etching (2)

A transparent conductor sheet was prepared and patterned as described in Example 3, except that 10 ppm of $KMnO_4$ was used. Unprotected nanowires were etched away within 30 seconds of the etching and a well-defined pattern was formed after etching for about one minute. Also, the area in which the matrix was present was not etched or disturbed by the etching solution. Like in Example 9, the protected area remained surface-conductive after the etching. In the interface between the conductive region and non-conductive region of the patterned surface, nanowires are actually severed and portions of these severed nanowires that, prior to etching, extended into the non-conductive region, are etched away. In this way, remaining portions of the severed wires are shorter than the original lengths of the wires prior to etching.

Example 5

Surface Pre-Treatment

Transparent conductor samples were patterned by wet-etching process. Prior to etching, the transparent conductor had been masked according to a pattern (physical mask or photoresist mask) and surface-treated in the unmasked regions. Compared to the untreated sample, surface-treated transparent conductors were etched at much higher rate.

Using Physical Mask:

Transparent conductor samples were prepared by first forming a silver nanowire film by spin-coating (or other deposition method) on substrates including polycarbonate, glass or PET, with desired transparency and conductivity. The silver nanowire film was subsequently coated with Addison Clear Wave AC YC-5619 hard coat (by spin-coating). The hard coat material was baked and fully UV cured.

A mask (e.g., a plastic film) having a desired pattern was placed on and in contact with the hard coat of the transparent conductor sample. The mask defined regions (unmasked) to be etched. The unmasked region was submitted to $O_2$ plasma for 10 minute or UV ozone treatment for 10 minutes.

The mask was removed and the sample was immersed in 100% Transene Ag Etchant Type TFS for 10 seconds before it was removed and rinsed in DI and air-dried.

Using Photoresist Mask:

Instead of a physical mask, a photoresist material can be spin-coated on the silver nanowire film (with a hard coat). When exposed to UV light according to a desired pattern, the photoresist material cures into a mask. The transparent conductor samples can be surface treated and etched following the process described above.

Results: As shown, Samples 1 and 2, which were pretreated by oxygen plasma and UV ozone respectively, became non-conductive (infinite resistivity) within 10 seconds of etching. In comparison, untreated Sample 3 remained conductive after 6 minutes of etching.

Sample 4 illustrates a process of invisible patterning in which a diluted etchant was used. Following an oxygen plasma treatment, patterning using 5% Transene Ag Etchant Type TFS created a patterned transparent conductor with substantially uniform optical properties. It is believed that the diluted etchant rendered transparent conductor film non-conductive without completely removing the nanowires.

Sample 1—Pretreated with Oxygen Plasma

|  |  | Total etch time | Initial | 10 sec |
|---|---|---|---|---|
| $O_2$ Plasma Treated Film | Film Resistivity (ohm) | | 66.4 | infinite |
| | 2 pt Contact Resistance (ohm) | | 70 | infinite |
| | % Transparency | | 87.6 | 90.0 |
| | % Haze | | 2.33 | 1.10 |

Sample 2—Pretreated with UV Ozone

|  |  | Total etch time | Initial | 10 sec |
|---|---|---|---|---|
| UV Ozone Treated Film | Film Resistivity (ohm) | | 63.5 | infinite |
| | 2 pt Contact Resistance (ohm) | | 60 | 1100 |
| | % Transparency | | 87.8 | 90.2 |
| | % Haze | | 2.33 | 1.10 |

Sample 3—Untreated

| Film Resistivity (ohm) | 57.4 | 90.9 | 110.2 | 130.5 | 234.1 | 473.9 |
|---|---|---|---|---|---|---|
| 2 pt Contact Resistance (ohm) | 70 | 1100 | 1000 | 1000 | 6000 | 1M |
| % Transparency | 87.7 | 87.9 | 87.9 | 88.0 | 88.1 | 88.2 |
| % Haze | 2.28 | 2.16 | 2.09 | 2.08 | 2.00 | 1.95 |

Sample 4—Dilute Etchant

|  |  | Total etch time | Initial | $O_2$ Plasma | 10 sec | 100 sec |
|---|---|---|---|---|---|---|
| 5% Ag Etchant Solution | Film Resistivity (ohm) | | 55 | 65.9 | Infinite | Infinite |
| | 2 pt Contact Resistance (ohm) | | 60 | 65 | Infinite | Infinite |
| | % Transparency | | 87.6 | 87.3 | 87.8 | 88.0 |
| | % Haze | | 2.71 | 2.84 | 4.93 | 4.40 |

Example 6

Low-Visibility Patterning

A suspension of HPMC, silver nanowires and water was prepared. The suspension was spin-coated on a glass substrate to form a thin conductive film of silver nanowires in an HPMC matrix. The conductive layer was optically clear, with an optical transmission (T %) of about 88.1% and haze (H %) of about 2.85%. The conductive layer is also highly surface-conductive with a surface resistivity of about 25Ω/□.

Thereafter, a region of the conductive film was treated with an oxidizing agent, e.g., a bleach solution having 0.5% hypochlorite, for 2 minutes. The treated film was then rinsed with water and dried in a nitrogen atmosphere. The treated region of the film showed substantially the same transmission (89.1 T %) and haze (5.85 H %) as compared to the optical properties of the untreated region. The treated region and the untreated region were visually uniform.

The surface resistivity of the treated region, however, increased by several orders of magnitude and became effectively insulating. Further the silver nanowires were broken or were likely to have been converted to an insoluble and insulating silver salt such as silver chloride.

A silver nanowire-based conductive film was treated with a stronger and more concentrated oxidizing agent: 30% hydrogen peroxide. In the treated region, nearly all of the nanowires and the organic HPMC matrix were dissolved. The optical properties in the treated region and the untreated region were notably different.

Example 7

A suspension of HPMC, silver nanowires and water was prepared. The suspension was spin-coated on a glass substrate to form a thin conductive film of silver nanowires in an HPMC matrix. The conductive layer was optically clear, with an optical transmission (T %) of about 89.1%, haze (H %) of about 3.02% and surface resistivity of about 45 Ω/□.

A region of the transparent conductor was soaked in a TCNQ solution with acetonitrile (ACN) (0.5 mg/ml) for different amounts of time, rinsed and dried in a nitrogen atmosphere. Table 3 below shows how the transparency, haze and resistivity of the region of the transparent conductor exposed to the TCNQ solution varied with amount of time exposed.

TABLE 3

|  | Before Soaking | 10 sec. | 20 sec. | 60 sec. |
|---|---|---|---|---|
| T % | 89.1 | 89.3 | 90.0 | 91.3 |
| H % | 3.02 | 2.36 | 1.74 | 0.53 |
| Ohm/Sq. | 45 | 112 | 1700 | Open Circuit |

As shown in Table 3, the change in resistivity of a treated region, with relatively little change in optical characteristics, can be controlled by changing the amount of time the treated region is exposed.

Example 8

The change in resistivity of a treated region may also be controlled depending on the chemical used to treat the region of altered resistivity. A transparent conducting sample was prepared as described above in example 7. A region of the sample was soaked in a solution of $Pd(AcO)_2$ and ACN (1 mg/mL) for varying amounts of time. The sample was then rinsed twice with ACN and dried in a nitrogen atmosphere. Table 4 below shows the change in optical characteristics (transparency and haze) and resistivity as a function of the amount of time the sample was exposed to the solution.

TABLE 4

|  | Before Soaking | 1 min. | 11 min. | 35 min. | 66 min. |
|---|---|---|---|---|---|
| T % | 89.5 | 89.4 | 89.2 | 88.7 | 88.5 |
| H % | 2.80 | 2.82 | 2.81 | 2.66 | 2.56 |
| Ohm/Sq. | 51 | 47 | 58 | 173 | 193 |

As illustrated by a comparison of Tables 3 and 4, the amount the resistivity of the exposed region changes with time can vary depending on the chemical the region is exposed to.

Example 9

Photoresist Patterning Method

A silver nanowire dispersion was prepared consisting of 0.2% HPMC, 250 ppm TritonX100 and silver nanowires. The dispersion was spin-coated onto a substrate and baked for 90 seconds at 180° C. This nanowire film was then spin-coated with AZ-3330F photoresist to make a 2.5 µm transparent conducting film. The transparent conductor was then baked at 110° C. for 60 seconds. A photomask was placed in contact with a portion of the photoresist layer and the transparent conductor was exposed to light for 20 seconds at 12 mW/cm$^2$. The conductor was then baked for 60 seconds at 110° C.

The photoresist was then developed with AZ300MIF developer, rinsed and spun dry. The conductor was then exposed to Transene silver etchant for 10 seconds, rinsed and spun dry. The photoresist was then stripped using Acetone. The transparent conductor was overcoated with Polyset PCX35-39B at 2.5% dilution in PGME and then cured for 45 min. at 180° C. The resulting patterned transparent conductor had a line-width of from 5 μm to 10 μm. Larger pattern line-widths have also been obtained using photoresist and other patterning methods disclosed herein. For example, line-widths from 10 μm to 300 μm and 10 μm to 50 μm have been obtained.

Example 10

Low-Visibility Patterning by Copper Chloride Etchant

An etchant solution was prepared by mixing 240 g of $CuCl_2.2H_2O$ with 180 g of concentrated HCl (37% w/w) and 580 g of water. The final concentration of $CuCl_2$ was about 19% and HCl was 6.8%.

A conductive film of silver nanowires was prepared according to the methods described herein. The conductive film was etched and it could be observed that the two regions showed little difference in optical properties, yet the etched region was less conductive and had a resistivity of about 20,000 Ω/sq.

Example 11

Low-Visibility Patterning—Etching by Heating

Example 11 demonstrates creating a low-visibility pattern in a conductive film by combining a partial etching step and a subsequent heating step. As discussed herein, the heating completes the etching by further rendering the etched region non-conductive or less conductive.

Table 5 shows that a heating step alone actually increases the film conductivity. In Trials A and B, conductive films (or samples) were heated for five and thirty minutes, respectively, and their sheet resistivities ($R_s$) were reduced by between 5 and 10 percent.

TABLE 5

| | Heating Step | |
|---|---|---|
| Trial A | $R_s$ (t = 0) | $R_s$ (t = 5 min at 130° C.) |
| | 106 Ω/sq | 94.5 Ω/sq |

TABLE 5-continued

| | Heating Step | |
|---|---|---|
| Trial B | $R_s$ (t = 0) | $R_s$ (t = 30 min at 130° C.) |
| | 106 Ω/sq | 98.5 Ω/sq |

Table 6 shows the effect of heating on a partially etched sample. In the three trials listed, the samples were chemically etched using a $CuCl_2$ etchant (as described in Example 18) until their sheet resistivity was approximately 1000 Ω/sq. They were then heated for either as much as five minutes but also as little as one minute at 130° C. In each trial, the heating step was sufficient to render the sample non-conductive. In other words, the damage of the nanowire network that was initially caused by the etching process was completed by the heating process.

TABLE 6

| | | Etching Step | Heating Step |
|---|---|---|---|
| Trial C | $R_s$ (t = 0) | $R_s$ (t = 90 s in etch bath at roughly 36° C.) | $R_s$ (t = 5 min at 130° C.) |
| | 106 Ω/sq | 1000 Ω/sq | Not conductive |
| Trial D | $R_s$ (t = 0) | $R_s$ (t = 70 s in etch bath at roughly 40° C.) | $R_s$ (t = 5 min at 130° C.) |
| | 121 Ω/sq | 1200 Ω/sq | Not conductive |
| Trial E | $R_s$ (t = 0) | $R_s$ (t = 120 s in etch bath at roughly 32° C.) | $R_s$ (t = 1 min at 130° C.) |
| | 121 Ω/sq | 1000 Ω/sq | Not conductive |

Table 7 shows that if the initial chemical etching step is insufficient, i.e., the damage to the nanowires is insufficient; it becomes difficult to make the samples non-conductive even with a subsequent heating step. In Trial F, a sample was etched until its resistance had changed from 108 to 120 Ω/sq. Subsequent heating for one minute at 130° C. did not change the sample resistance. In Trial G, another sample was etched until its resistance had changed from 121 to 198 Ω/sq. Subsequent heating at 130° C. for up to twenty-five minutes did continually increase the sample's resistivity; however, the sheet resistance failed to go beyond 685 Ω/sq. This shows that it is important for the initial partial etching to cause an etched region to reach a threshold resistivity (which is indicative of the extent of damage to the nanostructures) in order for the heating step to complete the etching.

TABLE 7

| | | Etching Step | Heating Step(s) | | | | |
|---|---|---|---|---|---|---|---|
| Trial F | $R_s$ (t = 0) | $R_s$ (t = 60 s in etch bath at roughly 33° C.) | $R_s$ (t = 1 min at 130° C.) | | | | |
| | 108 Ω/sq | 120 Ω/sq | 122 Ω/sq | | | | |
| Trial G | $R_s$ (t = 0) | $R_s$ (t = 90 s in etch bath at roughly 32° C.) | $R_s$ (t) at 130° C.) | | | | |
| | 121 Ω/sq | 198 Ω/sq | t(min) | 1 | 2 | 5 | 15 | 25 |
| | | | $R_s$ | 310 | 340 | 450 | 600 | 685 |

Table 8 compares the optical properties of two patterned samples: the sample in Trial I was etched chemically (by a $CuCl_2$ etchant) to be non-conductive and the sample in Trial H was partially etched followed by heating.

In Trial H, an initial partial etching brought the resistivity from 105 Ω/sq to 602 Ω/sq, which was sufficient for a subsequent heating step to make the sample non-conductive. As shown, the final optical properties were nearly identical to the initial properties of the sample (prior to etching), i.e., the difference in haze (H %) being about 0.01%, the difference in transmission (T %) being 0.1%. The sample had low-visibility patterns.

In Trial I, the sample was etched to be fully non-conductive. Here, although the transmission remained the same before and after the etching, the haze had decreased by about 0.07%, as compared to the pre-etching haze value. The bigger difference between the haze of etched and unetched areas of the film of Trial I (as compared to Trial H) made the etched areas more visible that those of Trial H.

TABLE 8

|  |  | Rs | T % | H % |
|---|---|---|---|---|
| Trial H<br>Etched to and<br>Then Heated<br>Non-<br>Conductivity | t = 0<br>Etched 180 s at 30° C.<br>Then Heated 90 s<br>at 130° C. | 105 Ω/sq<br>602 Ω/sq<br>Not Conductive | 91.8<br>91.7<br>91.7 | 1.18<br>1.27<br>1.19 |
| Trial I<br>Etched to Non-<br>Conductivity | t = 0<br>Etched 180 s at 32° C. | 103 Ω/sq<br>Not Conductive | 91.8<br>91.8 | 1.15<br>1.08 |

Example 12

Figure 4:
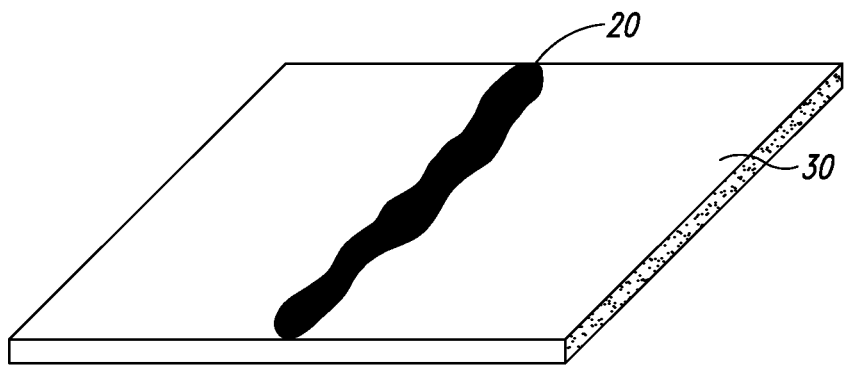
FIG. 4 shows an embodiment of the present disclosure in which an etchant formulation is printed in a line across the center of a conductive film sample.

Screen-printable etchant formulations were tested for their efficacy in etching conductive films formed from a conductive network of nanowires. Sample 2"×2" nanowire conductive films were prepared as described in Example 2 herein. Etchant formulations as indicated in Table 9 were prepared and placed in a line 20 across the center of the conductive film samples 30 as shown in FIG. 4. The Al etch indicated in the third column of Table 9 included from 50% to 70% phosphoric acid, from 3% to 10% acetic acid and from 1% to 5% nitric acid. The etchants were allowed to remain on the film samples at the baking temperatures and times shown in Table 9 and were then rinsed off using DI water. Prior to applying the etchant to the films, the sheet resistance of each sample was measured across the line along which the etchant was applied using a Delcom resistance measurement device. This same sheet resistance was measured after removal of the etchant. From the change in this sheet resistance before and after etching it was determined whether electrical isolation had been achieved across the etchant line. The results of the resistance measurements are shown in Table 9 below. Additionally, Table 9 indicates whether any reflow of the etchant was observed.

Example 13

Figure 5:
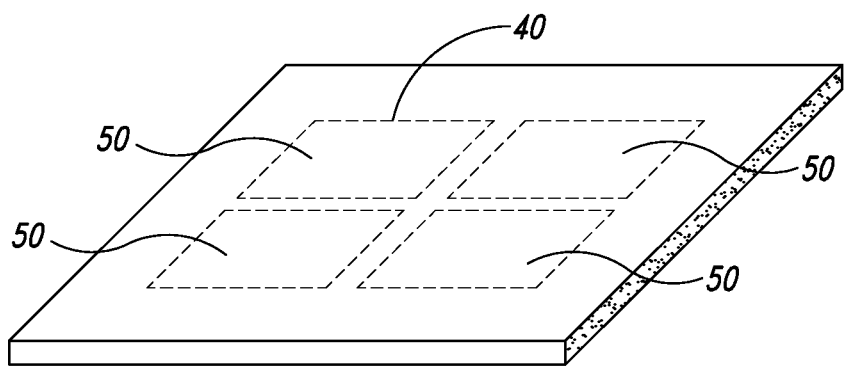
FIG. 5 shows a printed crossing line pattern on a conductive film to form un-etched and conductive squares.

An etchant having 22% Vestosint 2070 and 78% of an Aluminum etchant (sold under "Al Etchant Type A" by Transene Company, Inc.) comprising 50% to 70% phosphoric acid, from 3% to 10% acetic acid and from 1% to 5% nitric acid was screen printed onto a 2"×2" conductive film sample prepared as described in Example 2 herein. The etchant was printed in a crossing line 40 pattern to form four un-etched squares 50, as shown in FIG. 5. The sample was baked in a 50° C. oven for 15 minutes and the etchant was then rinsed off the sample using DI water. Prior to etching, a finite resistance was measurable between the squares. After etching, the squares were electrically isolated from each other.

Example 14

A typical ink composition for depositing metal nanowires comprises, by weight, from 0.0025% to 0.1% surfactant (e.g., a preferred range is from 0.0025% to 0.05% for ZONYL® FSO-100), from 0.02% to 4% viscosity modifier (e.g., a preferred range is 0.02% to 0.5% for hydroxypropyl methylcellulose (HPMC), from 94.5% to 99.0% solvent and from 0.05% to 1.4% metal nanowires. Representative examples of suitable surfactants include ZONYL® FSN, ZONYL® FSO, ZONYL® FSA, ZONYL® FSH, Triton (x100, x114, x45), TERGITOL®, DYNOL® (604, 607), n-dodecyl β-D-maltoside, and NOVEC®. Examples of suitable viscosity modifiers include hydroxypropyl methyl cellulose (HPMC), methyl cellulose, xanthan gum, polyvinyl alcohol, carboxy methyl cellulose, and hydroxy ethyl cellulose. Examples of suitable solvents include water and isopropanol.

The ink composition can be prepared based on a desired concentration of the nanowires, which is an index of the loading density of the final conductive film formed on the substrate.

The substrate can be any material onto which nanowires are deposited. The substrate can be rigid or flexible. Preferably, the substrate is also optically clear, i.e., light transmission of the material is at least 80% in the visible region (400 nm-700 nm).

Examples of rigid substrates include glass, polycarbonates, acrylics, and the like. In particular, specialty glass such as alkali-free glass (e.g., borosilicate), low alkali glass, and zero-expansion glass-ceramic can be used. The specialty

TABLE 9

| Polymer<br>Type | %<br>Polymer | % Al<br>Etch | %<br>Water | $R^1$ Start<br>(Ohms/sq) | Etch<br>Temp<br>(° C.) | Etch<br>Time | Reflow | $R^1$ End<br>(Ohms/sq) | %<br>Change<br>in R | Electrical<br>isolation |
|---|---|---|---|---|---|---|---|---|---|---|
| polyAMPS | 15.0 | 0.0 | 85.0 | 176.9 | 70 | 5 | No | 174.1 | −1.6 | x |
| polyAMPS | 15.0 | 0.0 | 85.0 | 185.1 | RT | 5 | No | 187.0 | 1.0 | x |
| polyAMPS | 11.3 | 25.0 | 63.8 | 198.4 | 50 | 1 | No | 203.2 | 2.4 | x |
| polyAMPS | 11.3 | 25.0 | 63.8 | 203.2 | 50 | 5 | No | 203.0 | 0.1 | x |
| polyAMPS | 11.3 | 25.0 | 63.8 | 336.7 | 50 | 15 | No | 1492.0 | 343.1 | x |
| polyAMPS | 3.8 | 75.0 | 21.3 | 202.0 | 50 | 1 | Yes | 203.2 | 0.6 | x |
| polyAMPS | 3.8 | 75.0 | 21.3 | 203.2 | 50 | 5 | Yes | 281.6 | 38.6 | x |
| polyAMPS | 3.8 | 75.0 | 21.3 | 281.6 | 50 | 15 | Yes | 1724.0 | 512.2 | ✓ |
| polyAMPS | 7.5 | 50.0 | 42.5 | 304.8 | 50 | 15 | No | 2222.0 | 629.0 | ✓ |
| Vestosint<br>2070 | 15.0 | 85.0 | 0.0 | 657.8 | 50 | 15 | Yes | 4545.0 | 590.9 | ✓ |
| Vestosint<br>2159 | 15.0 | 85.0 | 0.0 | 442.4 | 50 | 15 | Yes | 2702.0 | 510.8 | ✓ |
| Vestosint<br>2070 | 22.0 | 78.0 | 0.0 | ~220 | 50 | 15 | No | NC | >100 | ✓ |
| Vestosint<br>2159 | 20.0 | 80.0 | 0.0 | ~220 | 50 | 15 | No | NC | >100 | ✓ | glass is particularly suited for thin panel display systems, including Liquid Crystal Display (LCD).

Examples of flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, and cellulose acetate), polysulphones such as polyethersulphone, polyimides, silicones, and other conventional polymeric films.

The ink composition can be deposited on the substrate according to, for example, the methods described in co-pending U.S. patent application Ser. No. 11/504,822.

As a specific example, an aqueous dispersion of silver nanowires, i.e., an ink composition, was first prepared. The ink composition comprised, by weight, 0.2% silver nanowires, 0.4% HPMC, and 0.025% Triton x100. The ink was then slot-dye coated on PET in a roll-to-roll coating process.

As understood by one skilled in the art, other deposition techniques can be employed, e.g., sedimentation flow metered by a narrow channel, spin-coating, flow on an incline, slit coating, gravure coating, micro-gravure coating, bead coating, dip coating, and the like. Printing techniques can also be used to directly print an ink composition onto a substrate with or without a pattern. For example, inkjet, flexo-printing and screen printing can be employed.

Figure 6:
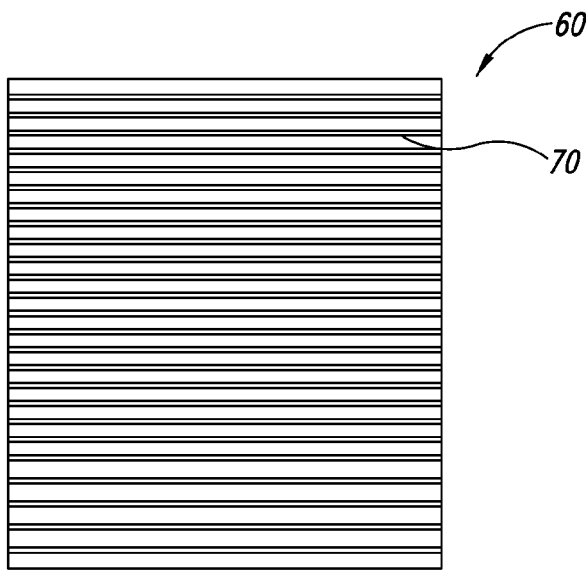
FIG. 6 shows a conductive film that was patterned with lines using the photoresist patterning of Example 9.

Following coating and drying, the resulting nanowire layer was overcoated in a slot-dye, roll-to-roll process with ACW 5619 available from Addison Clearwave, St. Charles, Ill. The resulting conductive film 60 was patterned with lines 70 as shown in FIG. 6 using the photoresist patterning method of Example 9. Other patterning methods may also be used to form a patterned film in accordance with the present disclosure including the screen-printable etchant patterning method of Examples 12 and 13. If the film is patterned using a screen-printable etchant as disclosed herein, after printing the etchant, the film can be annealed at 80° C. for approximately 105 seconds.

It was determined that if an acidic etchant was used in, for example, the photo-resist method or the screen-printable etchant method discussed above, and the patterned films washed with water either in a bath or with a pressurized spray, the reliability of the patterned film may be reduced.

In particular, the sheet resistance over time as measured by a Keithly Instruments sourcemeter of the patterned lines may increase in either a standard environment or an environment of increased heat and humidity (e.g., 60° C. at 90% humidity). However, if the patterned film is exposed to a base solution after patterning or patterning and annealing steps, and then washed with water, the increase in sheet resistance of the patterned lines is found to be lower.

Figure 7:
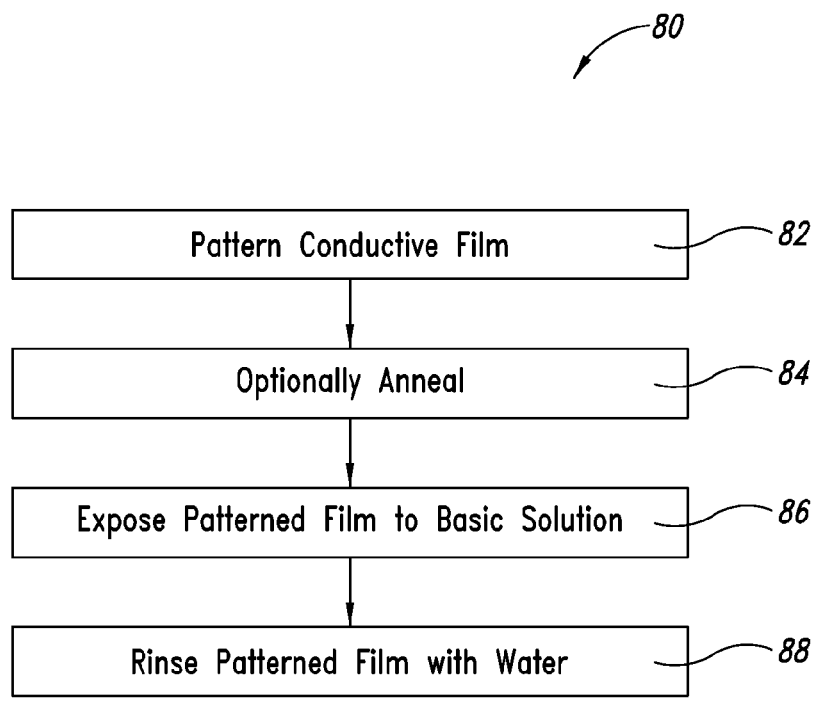
FIG. 7 is a flow chart illustrating a method in accordance with one embodiment.

FIG. 7 is a flow chart 80 illustrating a method in accordance with the present disclosure. More specifically, a conductive film is first patterned 82 according to the screen-printing method described herein. Thereafter, an optional annealing step 84 can be carried out. The patterned conductive film is then exposed to a basic (alkaline) solution 86, followed by a rinse with water 88.

In the method of FIG. 7, the patterned film may be exposed to the basic solution, for example, by placing the patterned film in a bath of the basic solution for 2 minutes at 50° C. The basic solution can be any solution having a basic pH. Such solutions include, for example and without limitation, NaOH, potassium hydroxide, organic bases including tetramethyl ammonium hydroxide and triethylamine. After exposure to the basic solution, the patterned film can be washed with water either in a bath, with a pressurized spray or otherwise.

Figure 8:
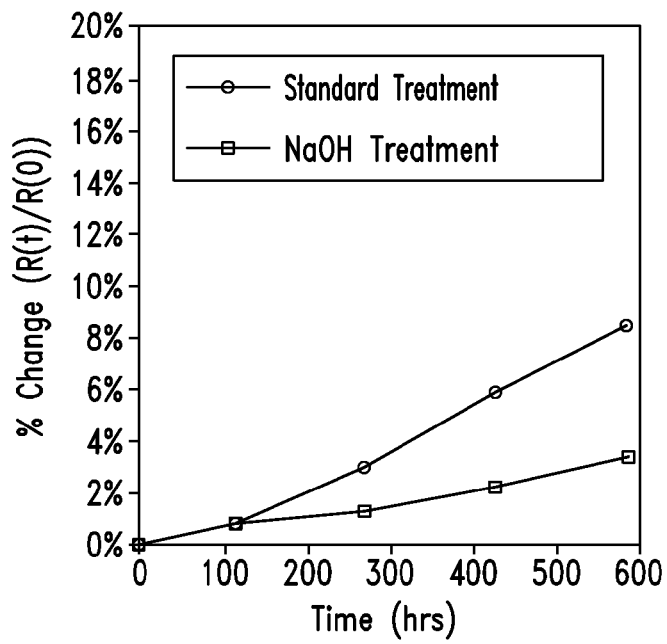
FIG. 8 illustrates the change in sheet resistance of patterned films using the photoresist patterning method according to one embodiment.

FIG. 8 illustrates the change in sheet resistance of patterned films using the photoresist patterning method discussed above. The standard treatment included only a water rinse after etching and the NaOH treatment included rinsing the patterned film for 2 minutes in an NaOH bath prior to the water rinse. The water rinse included rinsing the film in de-ionized water for about 2 minutes at around 50° C. As shown, the sheet resistance of lines of standard treatment film increased between 8% and 10% after about 580 hours from fabrication from a starting resistance value of around 18,000 ohms to 20,000 ohms. However, the sheet resistance of the lines of the NaOH treatment film increased by only about 2% to 4% over the same period of time (from a similar starting resistance). Both films were exposed to the same, ordinary environmental and light conditions.

Figure 9:
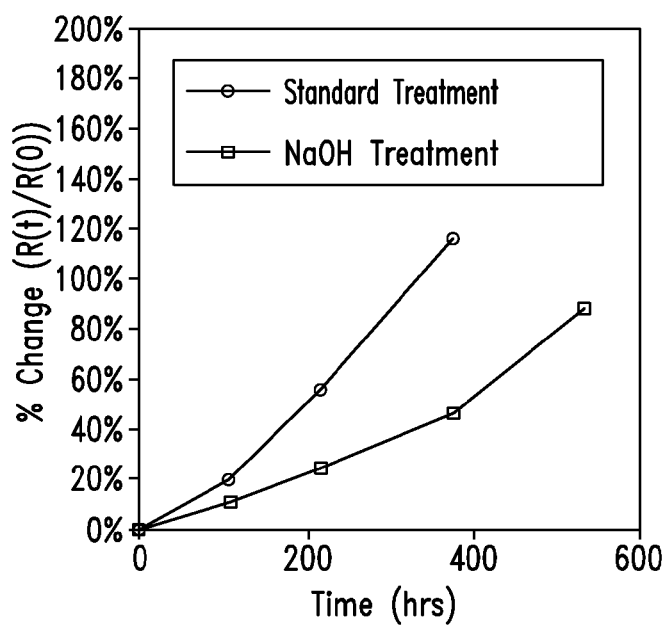
FIG. 9 illustrates the change in sheet resistance of patterned films using the photoresist patterning method according to one embodiment.

FIG. 9 illustrates the change in sheet resistance of patterned films using the photoresist patterning method discussed above. Unlike the films discussed above in association with FIG. 8, the films associated with FIG. 9 were, after the final water rinse, placed in an atmosphere at 60° C. and 90% humidity. As with the films associated with FIG. 8, the standard treatment included only a water rinse after etching and the NaOH treatment included rinsing the patterned film for 2 minutes in an NaOH bath prior to the water rinse. The water rinse included rinsing the film in de-ionized water for about 2 minutes at around 50° C. As shown, the sheet resistance of lines of standard treatment film increased about 120% after about 380 hours from fabrication from a starting resistance value of around 18,000 ohms to 20,000 ohms. However, the sheet resistance of the lines of the NaOH treatment film increased by only about 85% over the same period of time (from a similar starting resistance).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the disclosure have been described herein for purposes of illustration, various modifications may be made without deviating from the spirit and scope of the disclosure.

The invention claimed is:

1. A method comprising:
   providing a transparent conductor including a plurality of interconnected silver nanowires;
   screen-printing an acidic etchant on the transparent conductor according to a pattern; and
   providing a patterned transparent conductor by etching according to the pattern, the pattern defining a partially etched region and an unetched region; and
   after etching, heating the patterned transparent conductor, wherein the partially etched region becomes less conductive after heating, and the etched region and the unetched region are optically uniform.

2. The method of claim 1 wherein the acidic etchant comprises a solvent and one or more acids.

3. The method of claim 2 wherein the acidic etchant further comprising an acid-resistant polymer.

4. The method of claim 1 wherein etching provides the unetched region having a first intermediate resistivity, and the partially etched region having a second intermediate resistivity, wherein the second intermediate resistivity is less than 1000 times of the first intermediate resistivity; and wherein heating provides the etched region having a first final resistivity and the unetched region having a second final resistivity, wherein the second final resistivity is at least 1000 times of the first final resistivity.

5. The method of claim 2 wherein the acid is HCl, $HNO_3$, HOAC or $H_3PO_4$.

6. The method of claim 1 where the acidic etchant comprises HCl and $HNO_3$.

7. The method of claim 1 wherein the acidic etchant further comprises a metal halide.

8. The method of claim 7 wherein the metal halide is $FeCl_3$ or $CuCl_2$.

9. The method of claim 3 wherein the acid-resistant polymer is a polyamide or poly(2-acrylamido-2-methyl-1-propanesulfonic acid).

* * * * *